United States Patent
Iizuka

(10) Patent No.: US 8,152,925 B2
(45) Date of Patent: Apr. 10, 2012

(54) BAFFLE PLATE AND SUBSTRATE PROCESSING APPARATUS

(75) Inventor: Hachishiro Iizuka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 495 days.

(21) Appl. No.: 12/483,545

(22) Filed: Jun. 12, 2009

(65) Prior Publication Data

US 2009/0314432 A1 Dec. 24, 2009

Related U.S. Application Data

(60) Provisional application No. 61/088,749, filed on Aug. 14, 2008.

(30) Foreign Application Priority Data

Jun. 23, 2008 (JP) ................. 2008-163175

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/22* (2006.01)
(52) U.S. Cl. .................. 118/715; 156/345.26
(58) Field of Classification Search ............. 118/715; 156/345.26
See application file for complete search history.

(56) References Cited

U.S. PATENT DOCUMENTS

| | | | | |
|---|---|---|---|---|
| 4,590,042 A | * | 5/1986 | Drage | 422/186.06 |
| 5,433,780 A | * | 7/1995 | Ikeda et al. | 118/50 |
| 5,605,637 A | * | 2/1997 | Shan et al. | 216/71 |
| 5,868,848 A | * | 2/1999 | Tsukamoto | 118/723 E |
| 5,891,350 A | * | 4/1999 | Shan et al. | 216/71 |
| 5,900,103 A | * | 5/1999 | Tomoyasu et al. | 156/345.44 |
| 5,919,332 A | * | 7/1999 | Koshiishi et al. | 156/345.47 |
| 5,997,589 A | * | 12/1999 | Tien | 29/25.01 |
| 5,997,651 A | * | 12/1999 | Matsuse et al. | 118/725 |
| 6,120,605 A | * | 9/2000 | Sato | 118/715 |
| 6,178,919 B1 | * | 1/2001 | Li et al. | 118/723 E |
| 6,228,173 B1 | * | 5/2001 | Okase et al. | 118/719 |
| 6,251,188 B1 | * | 6/2001 | Hashimoto et al. | 118/715 |

(Continued)

FOREIGN PATENT DOCUMENTS

JP 2004-6574 1/2004

(Continued)

OTHER PUBLICATIONS

Korean Office Action issued on Mar. 15, 2011 in corresponding Korean Application No. 10-2009-0055946 (with a Partial English Translation).

*Primary Examiner* — Rudy Zervigon
(74) *Attorney, Agent, or Firm* — Oblon, Spivak, McClelland, Maier & Neustadt, L.L.P.

(57) ABSTRACT

A baffle plate, provided in a processing chamber for processing a substrate therein such that the baffle plate is disposed around a mounting table for mounting the substrate thereon, has a plurality of gas exhaust holes, through which a gas is exhausted from the processing chamber. The baffle plate has a stacked structure including a plurality of plate-shaped members. The baffle plate includes a pressure adjustment gas supply passageway to supply a pressure adjustment gas for adjusting a pressure in the processing chamber.

17 Claims, 7 Drawing Sheets

U.S. PATENT DOCUMENTS

| | | | | |
|---|---|---|---|---|
| 6,264,788 B1* | 7/2001 | Tomoyasu et al. | ....... | 156/345.43 |
| 6,391,147 B2* | 5/2002 | Imafuku et al. | ......... | 156/345.47 |
| 6,399,922 B2* | 6/2002 | Okase et al. | ................... | 219/405 |
| 6,506,685 B2* | 1/2003 | Li et al. | ....................... | 438/710 |
| 6,513,452 B2* | 2/2003 | Shan et al. | ................ | 118/723 E |
| 6,527,911 B1* | 3/2003 | Yen et al. | ................ | 156/345.43 |
| 6,531,069 B1* | 3/2003 | Srivastava et al. | ............. | 216/67 |
| 6,544,380 B2* | 4/2003 | Tomoyasu et al. | ........ | 156/345.51 |
| 6,586,343 B1* | 7/2003 | Ho et al. | ....................... | 438/758 |
| 6,726,801 B2* | 4/2004 | Ahn | ........................ | 156/345.29 |
| 6,733,620 B1* | 5/2004 | Sugiyama et al. | ....... | 156/345.29 |
| 6,767,429 B2* | 7/2004 | Amano | ..................... | 156/345.29 |
| 6,837,966 B2* | 1/2005 | Nishimoto et al. | ....... | 156/345.29 |
| 6,899,786 B2* | 5/2005 | Senzaki et al. | ........... | 156/345.43 |
| 6,963,043 B2* | 11/2005 | Fink | ......................... | 219/121.43 |
| 6,991,701 B2* | 1/2006 | Takenaka et al. | ........ | 156/345.51 |
| 7,101,458 B2* | 9/2006 | Oh et al. | .................. | 156/345.25 |
| 7,139,620 B2* | 11/2006 | Yamazaki et al. | ............. | 700/44 |
| 7,186,315 B2* | 3/2007 | Himori et al. | ............ | 156/345.47 |
| 7,311,784 B2* | 12/2007 | Fink | ............... | 118/728 |
| 7,416,677 B2* | 8/2008 | Takahashi | ....................... | 216/71 |
| 7,461,614 B2* | 12/2008 | Fink et al. | ................ | 118/723 E |
| 7,552,521 B2* | 6/2009 | Fink | .............................. | 29/557 |
| 7,560,376 B2* | 7/2009 | Escher et al. | ............. | 438/622 |
| 7,566,368 B2* | 7/2009 | Saigusa et al. | ............ | 118/715 |
| 7,566,379 B2* | 7/2009 | Nishimoto et al. | ...... | 156/345.43 |
| 7,601,242 B2* | 10/2009 | Fink | ....................... | 156/345.51 |
| 7,648,610 B2* | 1/2010 | Komiya et al. | .......... | 156/345.29 |
| 7,678,226 B2* | 3/2010 | Saigusa et al. | ........... | 156/345.51 |
| 7,767,055 B2* | 8/2010 | Himori et al. | ............ | 156/345.47 |
| 7,845,309 B2* | 12/2010 | Condrashoff et al. | .... | 118/723 E |
| 7,894,059 B2* | 2/2011 | Otsuki et al. | .................. | 356/337 |
| 7,951,262 B2* | 5/2011 | Koshiishi et al. | ........ | 156/345.44 |
| 7,987,814 B2* | 8/2011 | Carducci et al. | .......... | 118/723 R |
| 7,988,062 B2* | 8/2011 | Nonaka et al. | ..................... | 236/1 C |
| 8,006,640 B2* | 8/2011 | Sasaki | ..................... | 118/723 AN |
| 8,012,305 B2* | 9/2011 | Takahashi | ................ | 156/345.28 |
| 8,034,212 B2* | 10/2011 | Sato et al. | ................ | 156/345.46 |
| 8,057,600 B2* | 11/2011 | Nishimoto et al. | ........... | 118/715 |
| 8,058,186 B2* | 11/2011 | Moriya et al. | ................ | 438/795 |
| 8,075,728 B2* | 12/2011 | Balakrishna et al. | .... | 156/345.26 |
| 2001/0013504 A1* | 8/2001 | Imafuku et al. | ................. | 216/71 |
| 2001/0014540 A1* | 8/2001 | Shan et al. | .................... | 438/710 |
| 2001/0023744 A1* | 9/2001 | Komino | ........................ | 156/345 |
| 2001/0027843 A1* | 10/2001 | Komino et al. | ................ | 156/345 |
| 2002/0038791 A1* | 4/2002 | Okumura et al. | ................. | 216/71 |
| 2002/0088547 A1* | 7/2002 | Tomoyasu et al. | ........ | 156/345.47 |
| 2003/0019579 A1* | 1/2003 | Ahn | ........................ | 156/345.29 |
| 2003/0094135 A1* | 5/2003 | Komiya et al. | ............... | 118/715 |
| 2003/0217810 A1* | 11/2003 | Chen et al. | ................ | 156/345.29 |
| 2004/0020599 A1* | 2/2004 | Tanaka et al. | ............ | 156/345.29 |
| 2004/0026372 A1* | 2/2004 | Takenaka et al. | ................ | 216/71 |
| 2004/0149389 A1* | 8/2004 | Fink | ........................ | 156/345.51 |
| 2004/0182515 A1* | 9/2004 | Sato | ........................ | 156/345.43 |
| 2004/0244688 A1* | 12/2004 | Himori et al. | ............ | 118/723 E |
| 2004/0255863 A1* | 12/2004 | Higashiura et al. | ....... | 118/723 E |
| 2004/0261712 A1* | 12/2004 | Hayashi et al. | ........... | 118/723 E |
| 2005/0000441 A1* | 1/2005 | Kaeppeler et al. | ........ | 118/723 E |
| 2005/0000442 A1* | 1/2005 | Hayashi et al. | ........... | 118/723 E |
| 2005/0098111 A1* | 5/2005 | Shimizu et al. | ................ | 118/715 |
| 2005/0103440 A1* | 5/2005 | Sato et al. | ................ | 156/345.29 |
| 2005/0150456 A1* | 7/2005 | Senzaki et al. | ................ | 118/715 |
| 2005/0154482 A1* | 7/2005 | Tomoyasu | ..................... | 700/108 |
| 2005/0167052 A1* | 8/2005 | Ishihara et al. | .......... | 156/345.47 |
| 2005/0224180 A1* | 10/2005 | Bera et al. | ................ | 156/345.33 |
| 2006/0086259 A1* | 4/2006 | Okajo | ............................. | 99/342 |
| 2006/0169209 A1* | 8/2006 | Miyano | ........................ | 118/719 |
| 2006/0196604 A1* | 9/2006 | Moriya et al. | ........... | 156/345.34 |
| 2007/0113787 A1* | 5/2007 | Higashiura et al. | ...... | 118/723 E |
| 2007/0131167 A1* | 6/2007 | Kodashima et al. | .......... | 118/715 |
| 2007/0215284 A1* | 9/2007 | Oyabu | ..................... | 156/345.47 |
| 2007/0264444 A1* | 11/2007 | Otsuki et al. | .................. | 427/576 |
| 2008/0011424 A1* | 1/2008 | Yin et al. | ................. | 156/345.48 |
| 2008/0035605 A1* | 2/2008 | Takahashi | ....................... | 216/58 |
| 2009/0236043 A1* | 9/2009 | Matsudo et al. | ......... | 156/345.43 |
| 2009/0242132 A1* | 10/2009 | Sato | ........................ | 156/345.43 |
| 2009/0242133 A1* | 10/2009 | Nakayama et al. | ...... | 156/345.44 |
| 2009/0242515 A1* | 10/2009 | Honda et al. | ..................... | 216/67 |
| 2009/0246406 A1* | 10/2009 | Nakayama et al. | ........... | 427/569 |
| 2009/0314432 A1* | 12/2009 | Iizuka | ..................... | 156/345.27 |
| 2010/0000970 A1* | 1/2010 | Koshimizu et al. | ............. | 216/67 |

FOREIGN PATENT DOCUMENTS

KR 10-2008-0037176 A 4/2008

* cited by examiner

BAFFLE PLATE AND SUBSTRATE PROCESSING APPARATUS

FIELD OF THE INVENTION

The present invention relates to a baffle plate and a substrate processing apparatus used in a plasma process of a substrate.

BACKGROUND OF THE INVENTION

Conventionally, a substrate processing apparatus for performing a specific process on a substrate, such as a semiconductor wafer or a glass substrate for a liquid crystal display, which is loaded into a processing chamber has been used in a manufacturing process of, e.g., a semiconductor device. In the substrate processing apparatus, for example, a mounting table is disposed in a processing chamber to mount a substrate thereon, and a showerhead for supplying a processing gas is disposed to face the mounting table such that the processing gas is supplied toward the substrate mounted on the mounting table. Further, the substrate processing apparatus includes a baffle plate (also referred to as an exhaust plate) having a plurality of gas exhaust holes (circular holes, elongated holes, or rectangular holes). The baffle plate is disposed to surround the mounting table. A gas is evacuated from the processing chamber through the gas exhaust holes of the baffle plate.

In the substrate processing apparatus having the above-mentioned configuration, a gas is exhausted from the periphery of the mounting table through the baffle plate disposed around the mounting table. Accordingly, it contributes to uniformly maintain a pressure in the processing chamber and a flow of the processing gas, and to achieve process uniformity on the surface of the substrate. Further, in the substrate processing apparatus for processing a substrate by generating a plasma in a processing chamber, the above-mentioned baffle plate is disposed in the substrate processing apparatus, and a voltage is applied to the baffle plate to prevent the plasma from leaking out of a processing space (see, e.g., Japanese Patent Laid-open Publication No. 2004-6574 and corresponding U.S. Pat. No. 7,109,660).

As described above, conventionally, the baffle plate having a plurality of gas exhaust holes is disposed around the mounting table to achieve the uniformity of gas exhaust from the periphery of the mounting table and the confinement of plasma. However, even when the baffle plate is used, the processing gas flows from a central portion of the substrate to a peripheral portion of the substrate in a processing space above the substrate. As a result, a processing speed at the peripheral portion of the substrate is lower than that at the central portion of the substrate. That is, process uniformity (in-plane uniformity) is lowered.

SUMMARY OF THE INVENTION

In view of the above, the present invention provides a baffle plate and a substrate processing apparatus capable of improving process uniformity.

In accordance with a first aspect of the present invention, there is provided a baffle plate provided in a processing chamber for processing a substrate therein such that the baffle plate is disposed around a mounting table for mounting the substrate thereon, the baffle plate having a plurality of gas exhaust holes, through which a gas is exhausted from the processing chamber. The baffle plate has a stacked structure including a plurality of plate-shaped members, and the baffle plate includes a pressure adjustment gas supply passageway to supply a pressure adjustment gas for adjusting a pressure in the processing chamber.

The baffle plate may be configured to supply the pressure adjustment gas upward from an upper side thereof.

The baffle plate may be configured to supply the pressure adjustment gas downward from a lower side thereof.

The baffle plate may be configured to supply the pressure adjustment gas into the gas exhaust holes.

The baffle plate may be configured to separately control amounts of the pressure adjustment gas to be supplied through a plurality of sections divided in a circumferential direction of the mounting table.

Preferably, argon gas or nitrogen gas is supplied as the pressure adjustment gas.

The baffle plate may further include an electrode configured to supply a radio frequency power or configured to have a predetermined electric potential.

The baffle plate may further include a temperature control mechanism.

In accordance with a second aspect of the present invention, there is provided a substrate processing apparatus comprising: a processing chamber in which a substrate is processed; a mounting table disposed in the processing chamber to mount the substrate thereon; a processing gas supply mechanism configured to supply a processing gas into the processing chamber; and a baffle plate disposed around the mounting table, the baffle plate having a plurality of gas exhaust holes, through which a gas is exhausted from the processing chamber. The baffle plate has a stacked structure including a plurality of plate-shaped members, and the baffle plate includes a pressure adjustment gas supply passageway to supply a pressure adjustment gas for adjusting a pressure in the processing chamber.

In the apparatus, the baffle plate may be configured to supply the pressure adjustment gas upward from an upper side thereof.

In the apparatus, the baffle plate may be configured to supply the pressure adjustment gas downward from a lower side thereof.

In the apparatus, the baffle plate may be configured to supply the pressure adjustment gas into the gas exhaust holes.

The apparatus may be configured to separately control amounts of the pressure adjustment gas to be supplied through a plurality of sections divided in a circumferential direction of the mounting table.

In the apparatus, preferably, argon gas or nitrogen gas is supplied as the pressure adjustment gas.

In the apparatus, the baffle plate may further include an electrode configured to supply a radio frequency power or configured to have a predetermined electric potential.

In the apparatus, the baffle plate may further include a temperature control mechanism.

In the apparatus, the substrate may be plasma etched.

In accordance with the aspects of the present invention, it is possible to provide a baffle plate and a substrate processing apparatus including the baffle plate capable of improving process uniformity and achieving miniaturization of an apparatus.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
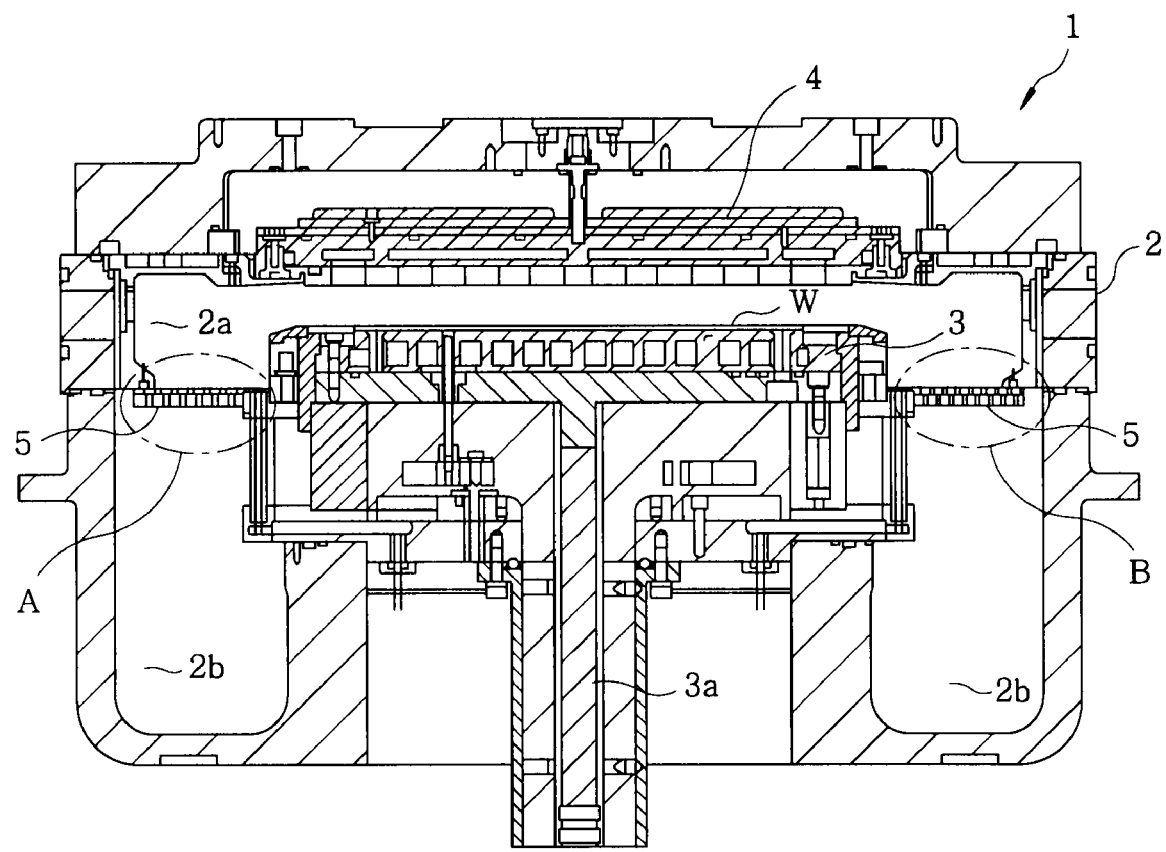
FIG. 1 illustrates a configuration of a plasma etching apparatus in accordance with an embodiment of the present invention.

Hereinafter, embodiments of the present invention will be described with reference to the accompanying drawings which form a part hereof. FIG. 1 illustrates a baffle plate and a plasma etching apparatus 1 serving as a substrate processing apparatus in accordance with an embodiment of the present invention.

The plasma etching apparatus 1 includes a hermetically sealed processing chamber 2 in which a substrate (in this embodiment, a semiconductor wafer W) is processed. The processing chamber 2 is made of, e.g., anodically oxidized aluminum. The processing chamber 2 is formed in an approximately cylindrical shape. The processing chamber 2 is electrically grounded. Also, the processing chamber 2 is provided at its sidewall with an opening (not shown), through which the semiconductor wafer W is loaded into or unloaded from the processing chamber 2, and a gate valve (not shown) configured to hermetically seal the opening.

The processing chamber 2 includes therein a susceptor (mounting table) 3 on which the semiconductor wafer W is mounted. The susceptor 3 is configured to serve as a lower electrode. Also, the susceptor 3 is provided with an electrostatic chuck for attracting and holding the semiconductor wafer W and a temperature control mechanism for controlling the temperature of the semiconductor wafer W.

A showerhead 4 is disposed at a ceiling of the processing chamber 2 to face the susceptor 3. The showerhead 4 is configured to supply a processing gas supplied from a processing gas supply source (not shown) toward the semiconductor wafer W mounted on the susceptor 3 in the form of a shower. The showerhead 4, the processing gas supply source and the like constitute a processing gas supply mechanism.

Further, the showerhead 4 serves as an electrode (upper electrode) facing the susceptor 3. The showerhead 4 and the susceptor (lower electrode) 3 constitute a pair of facing electrodes. The susceptor 3 is connected to at least one radio frequency (RF) power source (not shown) via a power supply part 3a disposed at a lower side of a central portion of the susceptor 3. Meanwhile, the showerhead 4 is connected to a ground potential.

A processing space 2a, in which a plasma is generated and the semiconductor wafer W is processed by the plasma, is defined above the susceptor 3 in the processing chamber 2. Further, an annular gas exhaust space 2b, which extends downward from a peripheral portion of the susceptor 3, is defined below the susceptor 3 in the processing chamber 2. Also, a baffle plate 5 is disposed around the susceptor 3 to separate the processing space 2a and the gas exhaust space 2b from each other. An outer peripheral portion of the baffle plate 5 is fixed to an inner wall of the processing chamber 2, and an inner peripheral part of the baffle plate 5 is fixed to a lower part of the susceptor 3.

Figure 1A:
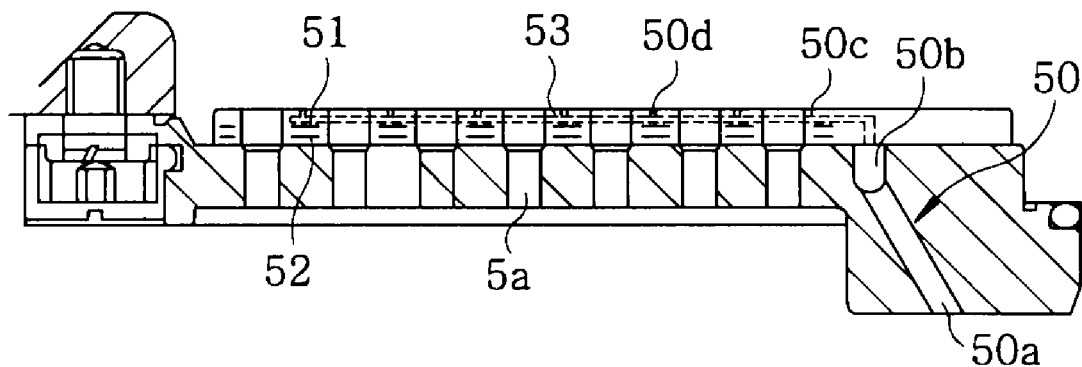
FIGS. 1A and 1B are enlarged views of the parts "A" and "B" in FIG. 1, respectively.
Figure 1B:
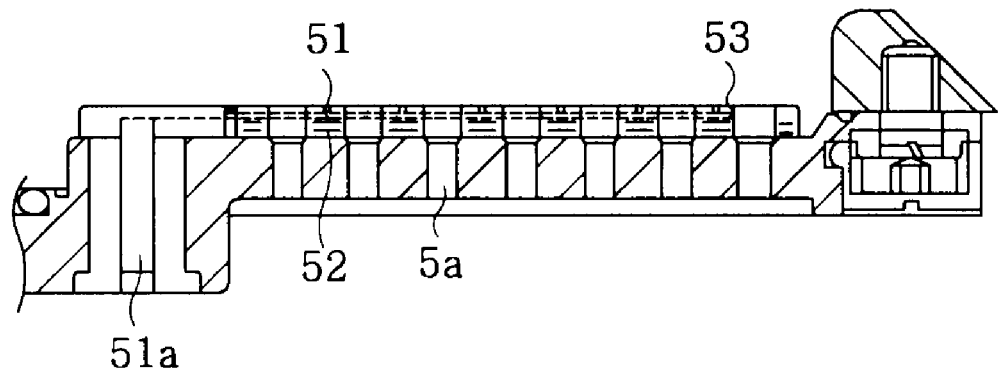
Figure 2:
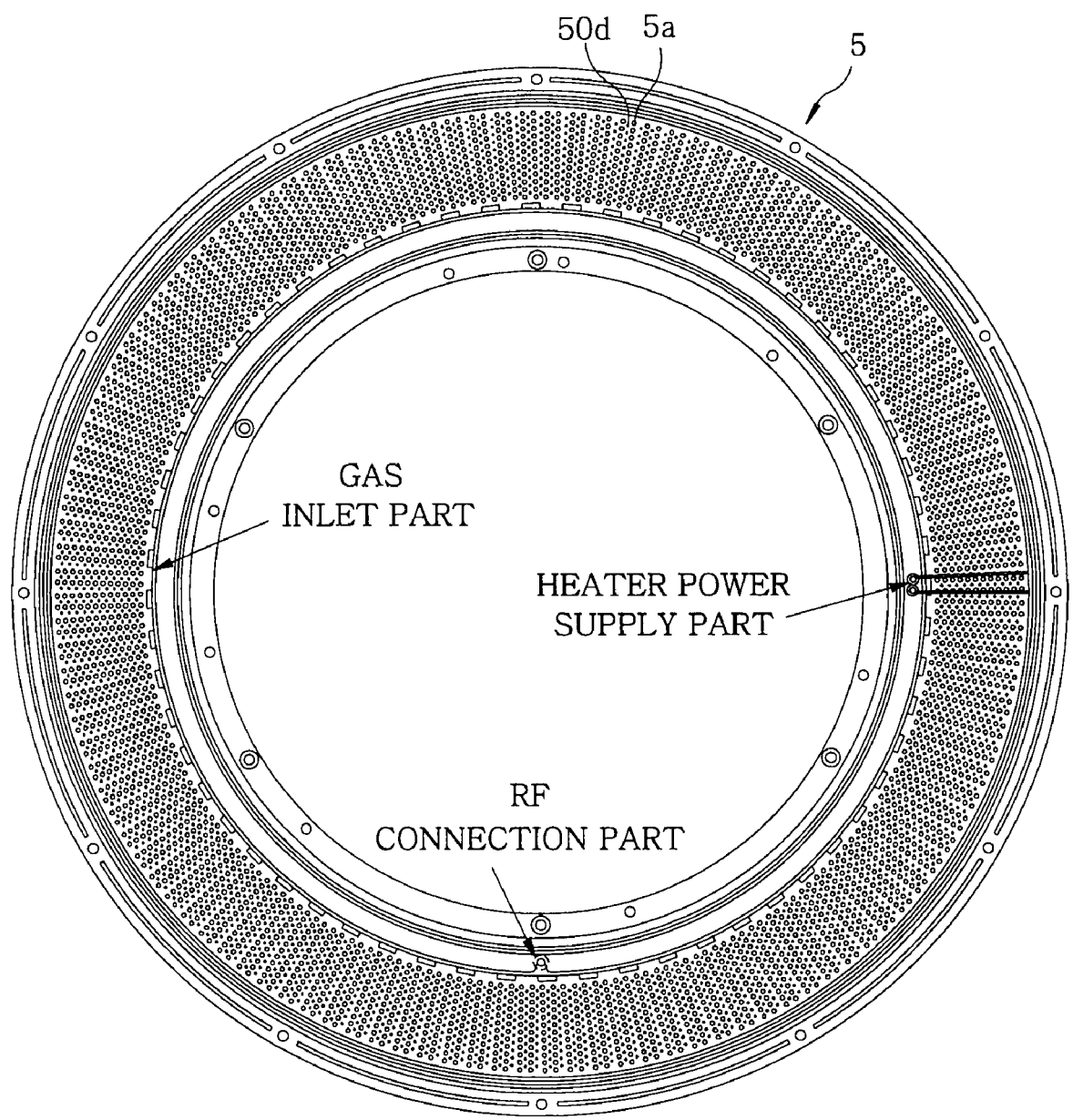
FIG. 2 is a top view of a baffle plate of the plasma etching apparatus of FIG. 1.

FIG. 2 is a top view of the baffle plate 5. As shown in FIG. 2, the baffle plate 5 has an approximately annular shape. Also, as shown in enlarged views of FIGS. 1A and 1B, the baffle plate 5 has a plurality of gas exhaust holes 5a formed vertically therethrough. In this embodiment, as shown in FIG. 2, the gas exhaust holes 5a are formed as circular holes (having a diameter of, e.g., 1 mm to several mm). However, the gas exhaust holes 5a are not limited to the circular holes, and may be formed as elongated holes, rectangular holes or the like. Also, the size of the gas exhaust holes 5a is not limited to the above-mentioned range. The processing chamber 2 (processing space 2a) is vacuum evacuated through the gas exhaust holes 5a by a vacuum pump such as a turbo molecular pump (not shown) connected to the gas exhaust space 2b of the processing chamber 2.

Figure 3:
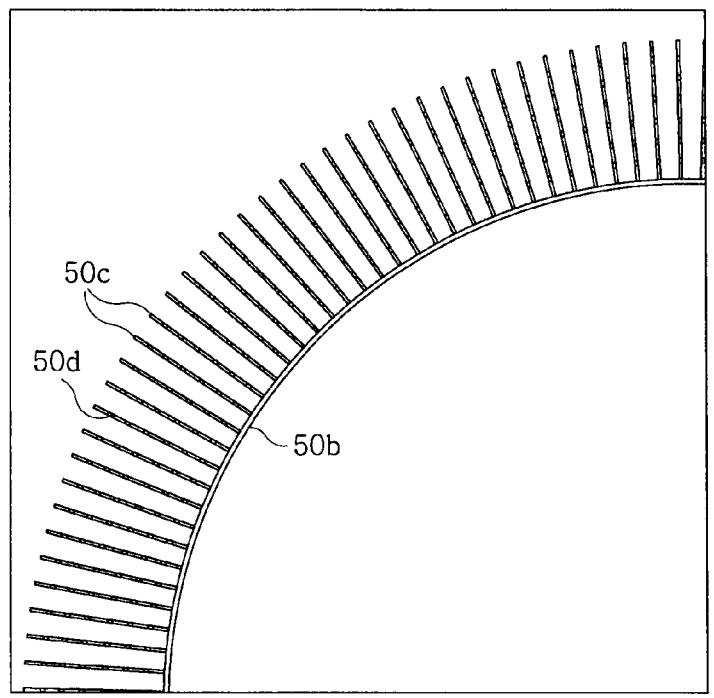
FIG. 3 illustrates a configuration of a main part of the baffle plate of the plasma etching apparatus of FIG. 1.

Also, a pressure adjustment gas supply passageway 50, serving as a pressure adjustment gas supply mechanism, is formed in the baffle plate 5. As shown in the enlarged view of FIG. 1A, the pressure adjustment gas supply passageway 50 includes a gas inlet part 50a disposed at a predetermined position of the inner peripheral portion of the baffle plate 5, and an inner peripheral side gas supply passageway 50b connected to the gas inlet part 50a and annularly formed along the inner peripheral portion of the baffle plate 5. The pressure adjustment gas supply passageway 50 further includes a plurality of radial gas supply passageways 50c extending in a diameter direction from the inner peripheral side gas supply passageway 50b toward the outer periphery of the baffle plate 5, and a plurality of vertical gas supply passageways 50d extending upward from the radial gas supply passageways 50c and opened at the top of the baffle plate 5. As shown in FIG. 2, the vertical gas supply passageways 50d are disposed between the gas exhaust holes 5a. Also, the vertical gas supply passageways 50d are uniformly distributed over the baffle plate 5. FIG. 3 schematically illustrates a positional relationship among the inner peripheral side gas supply passageway 50b, the radial gas supply passageways 50c, and the vertical gas supply passageways 50d.

In the pressure adjustment gas supply passageway 50 having the above configuration, a pressure adjustment gas (e.g., argon gas or nitrogen gas) supplied from a pressure adjustment gas supply source (not shown) to the gas inlet part 50a is discharged upward through a plurality of openings (openings of the vertical gas supply passageways 50d) formed at the top of the baffle plate 5 via the inner peripheral side gas supply passageway 50b, the radial gas supply passageways 50c, and the vertical gas supply passageways 50d. The pressure adjustment gas supply passageway 50 is configured by stacking a plurality of plate-shaped members having grooves and holes for the gas supply passageways. The baffle plate 5 has a stacked structure. Also, in this embodiment, the plate-shaped members of the pressure adjustment gas supply passageway 50 are made of an insulating material due to reasons which will be described later.

Figure 4:
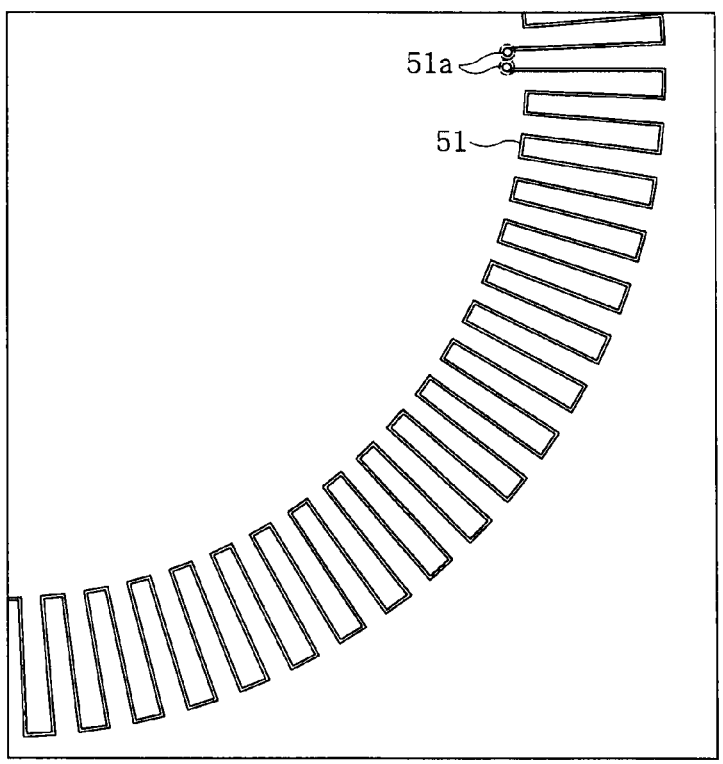
FIG. 4 illustrates a configuration of another main part of the baffle plate of the plasma etching apparatus of FIG. 1.
Figure 5:
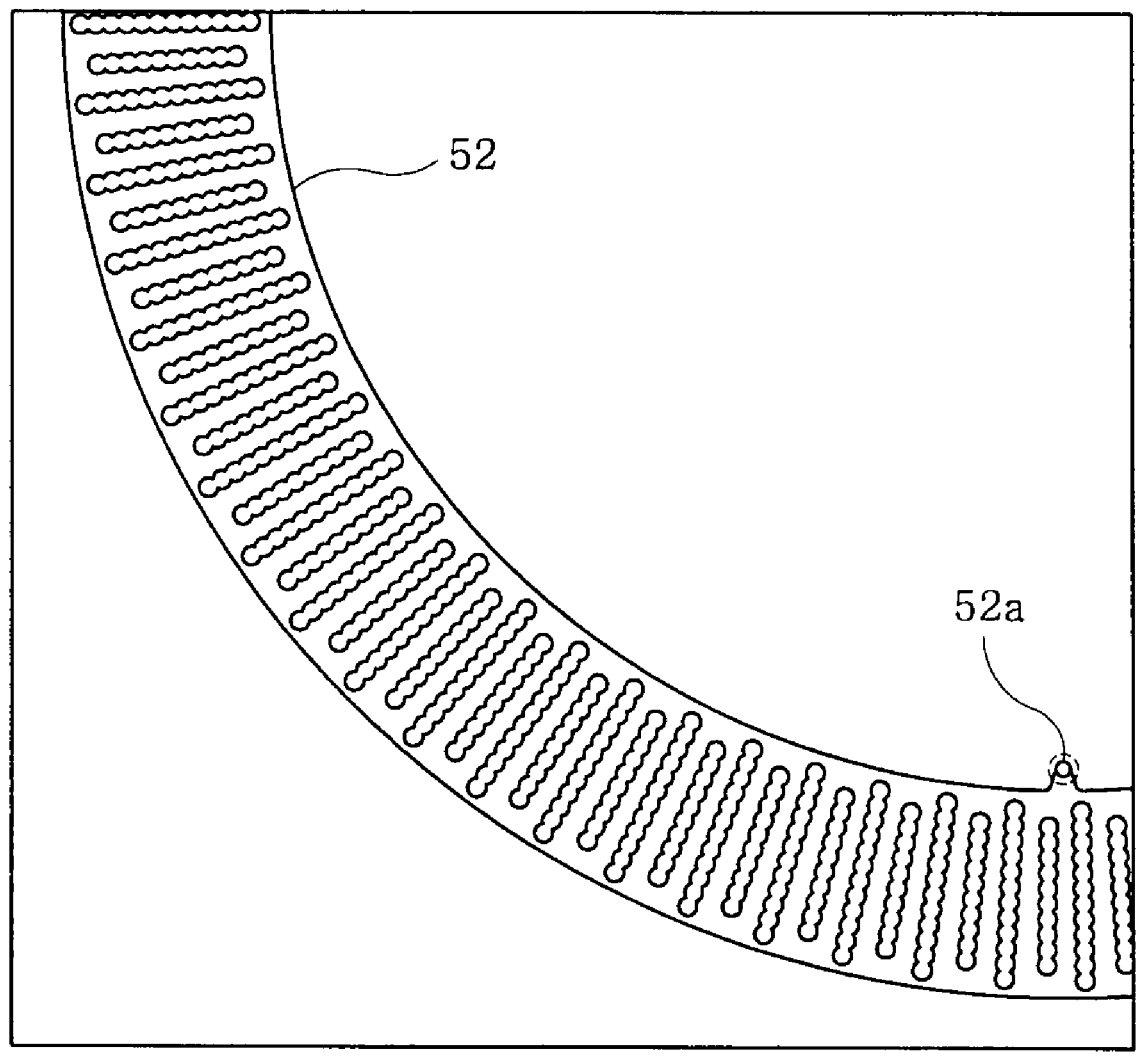
FIG. 5 illustrates a configuration of still another main part of the baffle plate of the plasma etching apparatus of FIG. 1.

Further, in this embodiment, as shown in the enlarged views of FIGS. 1A and 1B, the baffle plate 5 has a heater 51 serving as a temperature adjustment mechanism and an electrode 52, which are stacked at the lower side of the radial gas supply passageways 50c with an insulating layer interposed therebetween. Also, the surface of the baffle plate 5 is covered with an insulating layer 53. Therefore, the baffle plate 5 is configured to have a stacked structure in which a plurality of plate-shaped members (at least a top surface of which is made of an insulating material) are stacked while the heater 51 made of metal and the electrode 52 are interposed therebetween. FIG. 4 schematically illustrates a pattern example of the heater 51 embodied by a resistance heater made of metal, and FIG. 5 schematically illustrates a pattern example of the electrode 52.

As shown in FIG. 4, the heater 51 is disposed such that the heater 51 bypasses the gas exhaust holes 5a. In the example of FIG. 4, the heater 51 has a rectangular bent pattern. In FIG. 4 (and FIG. 1), reference numeral 51a indicates a heater power supply part for supplying a power to the heater 51. As shown in FIG. 5, the electrode 52 is disposed such that the electrode 52 bypasses the gas exhaust holes 5a and occupies a remaining region excluding the gas exhaust holes 5a. The electrode 52 may be connected to a radio frequency power source such that the electrode 52 is used to supply a radio frequency power. Alternatively, the electrode 52 may be configured to have a predetermined electric potential such as a ground potential. In FIG. 5, reference numeral 52a indicates a radio frequency connection part connected to the radio frequency power source or the like.

Figure 7:
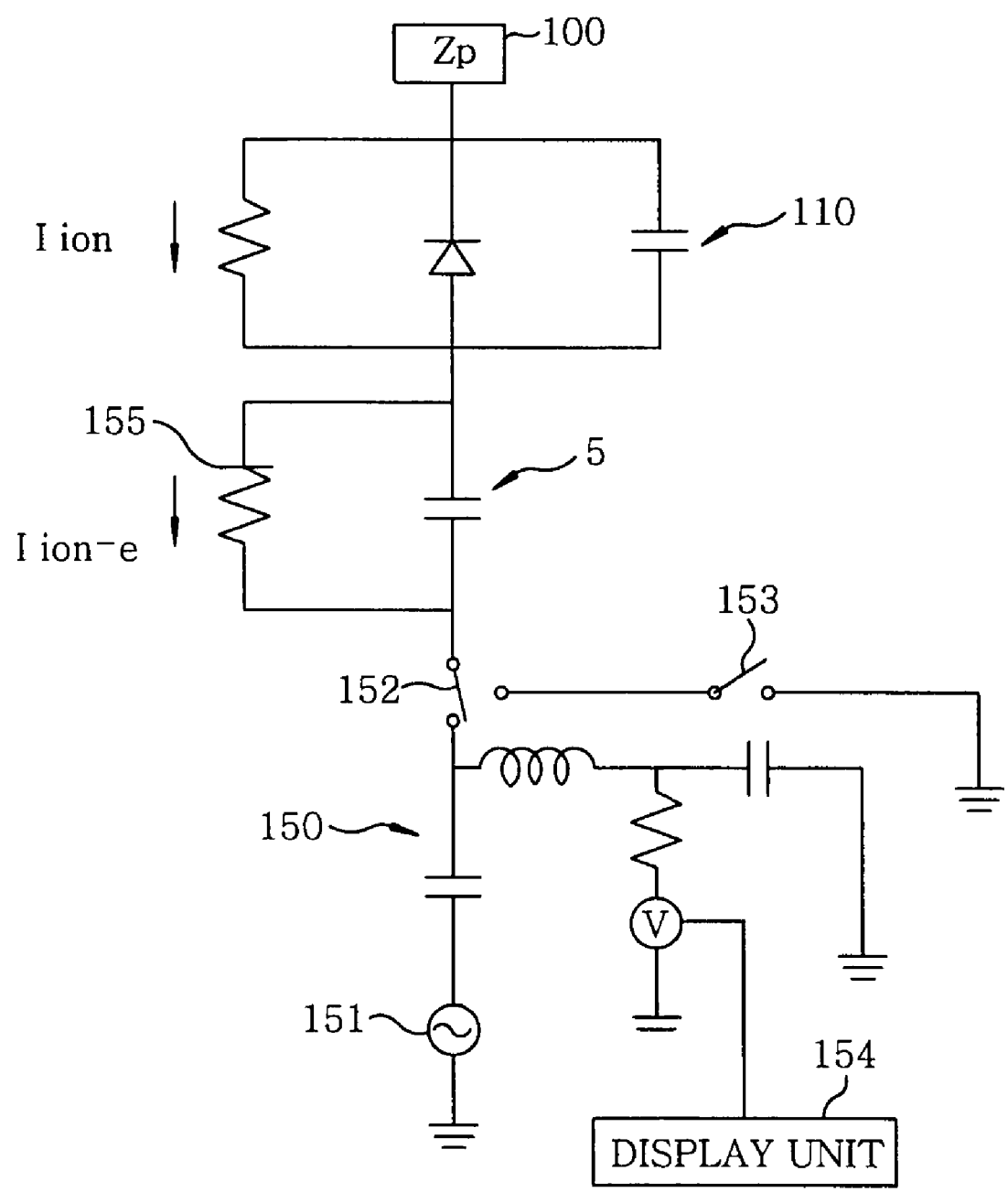
FIG. 7 illustrates an equivalent circuit in a case in which an electrode is connected to a radio frequency power source or is configured to have a predetermined electric potential such as a ground potential.

FIG. 7 illustrates an equivalent circuit when the electrode 52 is connected to the radio frequency power source or has a predetermined electric potential such as a ground potential. As shown in FIG. 7, a plasma 100 of the equivalent circuit has a plasma impedance Zp. A plasma sheath 110 is represented by a circuit in which a capacitor indicating a capacitance of the plasma sheath 110, a diode restricting the electric current at a boundary, and a resistor restraining the flow of ions are connected to each other in parallel. A matching unit 150 and a radio frequency power source 151 are connected to the baffle plate 5. Also, the baffle plate 5 may be disconnected from the radio frequency power source 151 and may be set to have the predetermine electric potential such as the ground potential by using switches 152 and 153. Also, an exposure electrode 155 may be provided at the surface of the baffle plate 5 to constitute a self-bias voltage measurement circuit. In this case, the baffle plate 5 is represented by a circuit in which a capacitor indicating the electrode 52 covered with an insulating member and a resistor indicating the exposure electrode 155 are connected to each other in parallel. A voltage of the matching unit 150 is measured and displayed on a display unit 154.

A plasma etching process of a semiconductor wafer W using the plasma etching apparatus 1 having the above configuration is carried out as follows. First, the semiconductor wafer W is loaded into the processing chamber 2 through a loading/unloading port (not shown), and is then mounted on the susceptor 3. Subsequently, the semiconductor wafer W is electrostatically attracted and held on the susceptor 3 by the electrostatic chuck. Then, the loading/unloading port is closed, and the processing chamber 2 is evacuated to a predetermined vacuum level by using the vacuum pump.

Subsequently, a predetermined amount of a processing gas (etching gas) is supplied from the showerhead 4 to the semiconductor wafer W on the susceptor 3 in the form of a shower. Meanwhile, a pressure adjustment gas, such as argon gas or nitrogen gas, is supplied into the processing chamber 2 through the pressure adjustment gas supply passageway 50 of the baffle plate 5. The pressure adjustment gas serves to adjust the pressure in the processing chamber 2 (especially, the processing space 2a in which the semiconductor wafer W is placed). If the amount of the pressure adjustment gas is increased, the pressure in the processing space 2a increases.

On the other hand, if the amount of the pressure adjustment gas is decreased, the pressure in the processing space 2a decreases. As described above, when the pressure is adjusted by adjusting the amount of the pressure adjustment gas, the pressure adjustment can be achieved more rapidly and accurately than conventional pressure adjustment using a valve of a gas exhaust system. Also, in this case, the minute adjustment of pressure can be easily achieved. Further, as the pressure is adjusted by adjusting the amount of the pressure adjustment gas, it is possible to omit a conventionally used automatic pressure controller (APC).

Further, in this case, the pressure adjustment gas is supplied to a space around the semiconductor wafer W placed in the processing space 2a, not to a space right above the semiconductor wafer W, and therefore, it is possible to prevent the processing gas present in the space right above the semiconductor wafer W, which contributes to the processing of the semiconductor wafer W, from being diluted with the pressure adjustment gas.

After the pressure in the processing chamber 2 is maintained at a predetermined pressure level, a radio frequency power of a predetermined frequency, e.g., 13.56 MHz is applied to the susceptor 3. Consequently, a radio frequency electric field is generated between the showerhead 4, serving as the upper electrode, and the susceptor 3, serving as the lower electrode, and an etching gas is dissociated and converted into a plasma. The semiconductor wafer W is etched by using the plasma.

In this etching process, the pressure in the space around the semiconductor wafer W becomes higher than that in the space right above the semiconductor wafer W by supplying the pressure adjustment gas to the space around the semiconductor wafer W through the pressure adjustment gas supply passageway 50 of the baffle plate 5. Accordingly, a pressure is applied to the plasma generated in the processing space 2a such that the plasma can be directed to the space right above the semiconductor wafer W. Consequently, it is possible to prevent the diffusion of the plasma into the space around the semiconductor wafer W. Also, it is possible to prevent the deterioration of in-plane uniformity in processing, e.g., deterioration of a processing speed at a peripheral portion of the semiconductor wafer W.

In addition, it is possible to increase the density of the plasma in the space above the baffle plate 5, i.e., the space around the semiconductor wafer W by applying a radio frequency power to the electrode 52 of the baffle plate 5. Accordingly, it is possible to further prevent the deterioration of in-plane uniformity in processing, e.g., the deterioration in a processing speed at the peripheral portion of the semiconductor wafer W.

Also, it is possible to increase the temperature in the space above the baffle plate 5, i.e., the space around the semiconductor wafer W by supplying a power to the heater 51. Accordingly, it is possible to further prevent the deterioration of in-plane uniformity in processing, e.g., deterioration in a processing speed at the peripheral portion of the semiconductor wafer W.

When the plasma etching process is completed, the application of the radio frequency power, the supply of the processing gas, and the supply of the pressure adjustment gas are stopped, and the semiconductor wafer W is unloaded from the processing chamber 2 in reverse order.

As described above, in the baffle plate 5 in accordance with the embodiment of the present invention and the plasma etching apparatus 1 including the baffle plate 5, it is possible to adjust the state of the plasma around the semiconductor wafer W in the processing chamber 2 and above the peripheral portion of the semiconductor wafer W and to mainly control the processed state at the peripheral portion of the semiconductor wafer W. Consequently, it is possible to restrain the deterioration of in-plane uniformity in processing, e.g., the deterioration in a processing speed at the peripheral portion of the semiconductor wafer W. Also, the pressure adjustment through the adjustment of the amount of the pressure adjustment gas can be achieved more rapidly and accurately than the conventional pressure adjustment using a valve of a gas exhaust system. Furthermore, the minute adjustment of pressure can be easily achieved through the adjustment of the amount of the pressure adjustment gas.

Although the pressure adjustment gas is supplied upward from the baffle plate 5 in this embodiment, the pressure adjustment gas may be supplied downward from the baffle plate 5. Also, it is possible to supply the pressure adjustment gas through the sidewalls of the gas exhaust holes 5a of the baffle plate 5.

Figure 6:
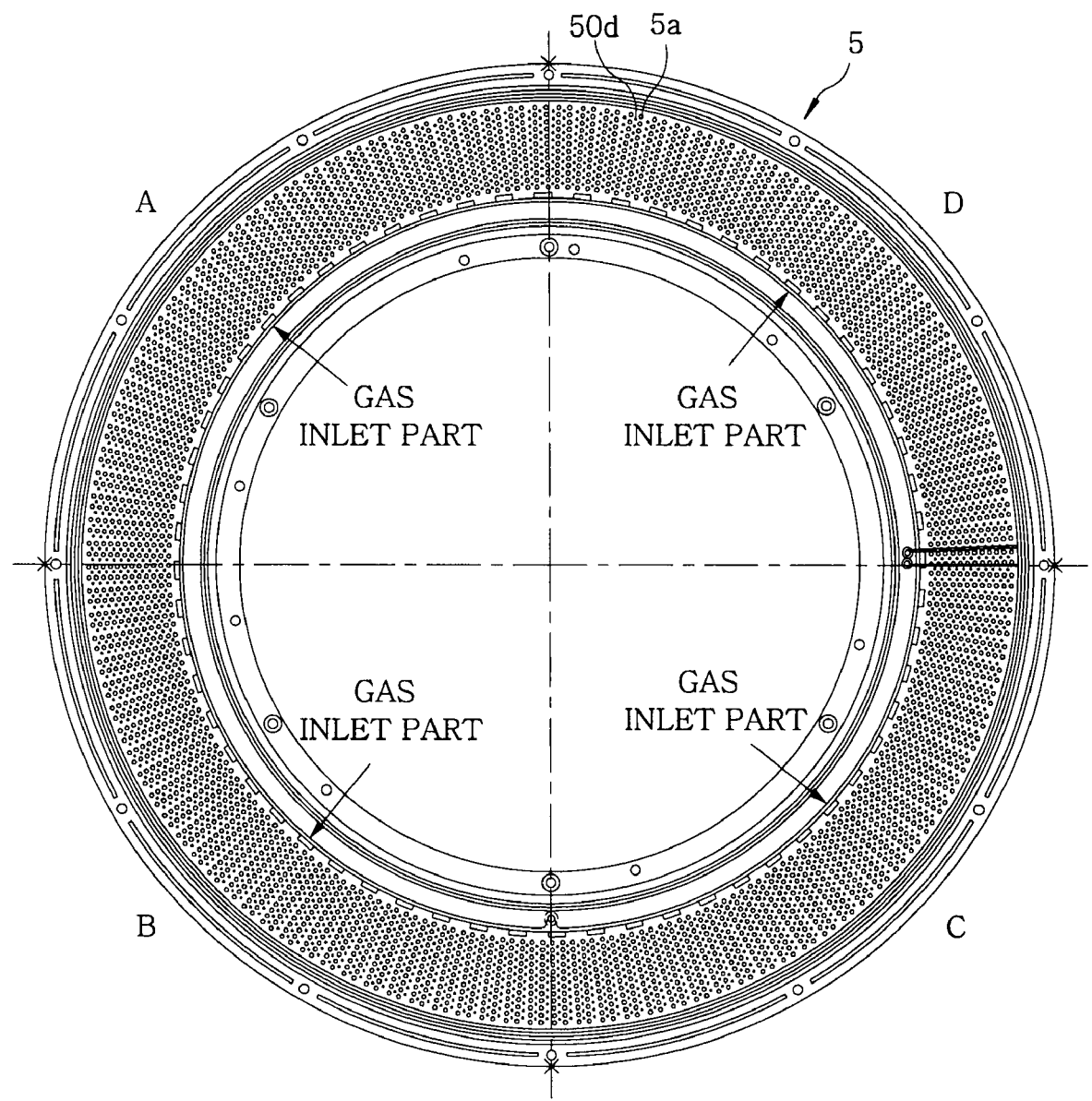
FIG. 6 illustrates a configuration of a baffle plate in accordance with another embodiment of the present invention.

Further, although the pressure adjustment gas is supplied through a single pressure adjustment gas supply passageway 50 formed in the baffle plate 5 in this embodiment, as shown in FIG. 6, the baffle plate 5 may be divided into a plurality of sections, e.g., four sections A to D, in the circumferential direction of the mounting table 3. In this case, individual pressure adjustment gas supply passageways may be formed in the respective sections A to D such that different amounts of pressure adjustment gases are supplied through the respective pressure adjustment gas supply passageways. In this structure, for example, when a turbo molecular pump for evacuation is disposed eccentrically with respect to a central axis of the processing chamber 2 and the processing chamber 2 is nonuniformly evacuated, that is, the pressure in the section near the turbo molecular pump decreases while the pressure in the section distant from the turbo molecular pump increases, it is possible to render uniform the pressure in the processing chamber 2 by varying the amounts of the pressure adjustment gases supplied to the respective sections (such that the amount of the pressure adjustment gas supplied to the lower pressure section is greater than that of the pressure adjustment gas supplied to the higher pressure section). Consequently, it is possible to prevent the deterioration of in-plane uniformity in processing due to the positional difference in the circumferential direction of the semiconductor wafer W.

The present invention is not limited to the above-described embodiment, but may be variously modified. For example, although the present invention is applied to the plasma etching apparatus in the above-described embodiment, the present invention is not limited to the plasma etching apparatus, and may be applied to a film forming apparatus, such as a chemical vapor deposition (CVD) apparatus, and other substrate processing apparatuses. Also, although the showerhead is configured to have a ground potential in the above-described embodiment, the present invention may be applied to a substrate processing apparatus configured such that radio frequency power is applied to the showerhead.

While the invention has been shown and described with respect to the embodiments, it will be understood by those skilled in the art that various changes and modification may be made without departing from the scope of the invention as defined in the following claims.

What is claimed is:

1. A baffle plate provided in a processing chamber for processing a substrate therein such that the baffle plate is disposed around a mounting table for mounting the substrate thereon, the baffle plate having a plurality of gas exhaust holes, through which a gas is exhausted from the processing chamber,
wherein the baffle plate has a stacked structure including a plurality of plate-shaped members, and the baffle plate includes a pressure adjustment gas supply passageway to supply a pressure adjustment gas for adjusting a pressure in the processing chamber.

2. The baffle plate of claim 1, wherein the baffle plate is configured to supply the pressure adjustment gas upward from an upper side thereof.

3. The baffle plate of claim 1, wherein the baffle plate is configured to supply the pressure adjustment gas downward from a lower side thereof.

4. The baffle plate of claim 1, wherein the baffle plate is configured to supply the pressure adjustment gas into the gas exhaust holes.

5. The baffle plate of claim 1, wherein the baffle plate is configured to separately control amounts of the pressure adjustment gas to be supplied through a plurality of sections divided in a circumferential direction of the mounting table.

6. The baffle plate of claim 1, wherein argon gas or nitrogen gas is supplied as the pressure adjustment gas.

7. The baffle plate of claim 1, further comprising an electrode configured to supply a radio frequency power or configured to have a predetermined electric potential.

8. The baffle plate of claim 1, further comprising a temperature control mechanism.

9. A substrate processing apparatus comprising:
a processing chamber in which a substrate is processed;
a mounting table disposed in the processing chamber to mount the substrate thereon;
a processing gas supply mechanism configured to supply a processing gas into the processing chamber; and
a baffle plate disposed around the mounting table, the baffle plate having a plurality of gas exhaust holes, through which a gas is exhausted from the processing chamber,
wherein the baffle plate has a stacked structure including a plurality of plate-shaped members, and the baffle plate includes a pressure adjustment gas supply passageway to supply a pressure adjustment gas for adjusting a pressure in the processing chamber.

10. The apparatus of claim 9, wherein the baffle plate is configured to supply the pressure adjustment gas upward from an upper side thereof.

11. The apparatus of claim 9, wherein the baffle plate is configured to supply the pressure adjustment gas downward from a lower side thereof.

12. The apparatus of claim 9, wherein the baffle plate is configured to supply the pressure adjustment gas into the gas exhaust holes.

13. The apparatus of claim 9, wherein the apparatus is configured to separately control amounts of the pressure adjustment gas to be supplied through a plurality of sections divided in a circumferential direction of the mounting table.

14. The apparatus of claim 9, wherein argon gas or nitrogen gas is supplied as the pressure adjustment gas.

15. The apparatus of claim 9, wherein the baffle plate further includes an electrode configured to supply a radio frequency power or configured to have a predetermined electric potential.

16. The apparatus of claim 9, wherein the baffle plate further includes a temperature control mechanism.

17. The apparatus of claim 9, wherein the substrate is plasma etched.

* * * * *